(12) United States Patent
Son

(10) Patent No.: US 7,157,303 B2
(45) Date of Patent: Jan. 2, 2007

(54) THIN FILM TRANSISTOR ARRAY SUBSTRATE AND FABRICATING METHOD THEREOF

(75) Inventor: Hyeon-Ho Son, Gyeonggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 11/003,370

(22) Filed: Dec. 6, 2004

(65) Prior Publication Data

US 2005/0127359 A1    Jun. 16, 2005

(30) Foreign Application Priority Data

Dec. 11, 2003   (KR) .................... 10-2003-0090305

(51) Int. Cl.
*H01L 21/00*   (2006.01)
*H01L 31/376*  (2006.01)

(52) U.S. Cl. .......................... 438/74; 257/59

(58) Field of Classification Search ............... 349/39, 349/43, 48, 141; 257/59, 296, 88; 438/29, 438/69, 74, 116, 129, 149
See application file for complete search history.

(56) References Cited

U.S. PATENT DOCUMENTS

| | | | |
|---|---|---|---|
| 5,598,285 A | 1/1997 | Kondo et al. | 349/39 |
| 5,838,037 A | 11/1998 | Masutani et al. | 257/296 |
| 5,946,060 A | 8/1999 | Nishiki et al. | 349/48 |
| 5,990,987 A | 11/1999 | Tanaka | 349/43 |
| 6,028,653 A | 2/2000 | Nishida | 349/141 |
| 6,097,454 A | 8/2000 | Zhang et al. | 349/43 |
| 6,266,166 B1 | 7/2001 | Katsumata et al. | 359/3 |
| 6,288,763 B1 | 9/2001 | Hirota | 349/141 |
| 6,297,866 B1 | 10/2001 | Seo et al. | 349/141 |

FOREIGN PATENT DOCUMENTS

JP   2001-154636   6/2001

*Primary Examiner*—Calvin Lee
(74) *Attorney, Agent, or Firm*—McKenna Long & Aldridge LLP

(57) ABSTRACT

A thin film transistor array substrate structure includes a plurality of data lines; a plurality of gate lines intersecting the data lines to define pixel areas, the gate line being adjacent to at least two pixel areas; a plurality of common lines disposed between the at least two pixel areas; a plurality of thin film transistors formed at each intersection between the gate lines and the data lines; a plurality of common electrodes provided substantially parallel to the common lines; and a plurality of pixel electrodes connected to the thin film transistors.

5 Claims, 16 Drawing Sheets

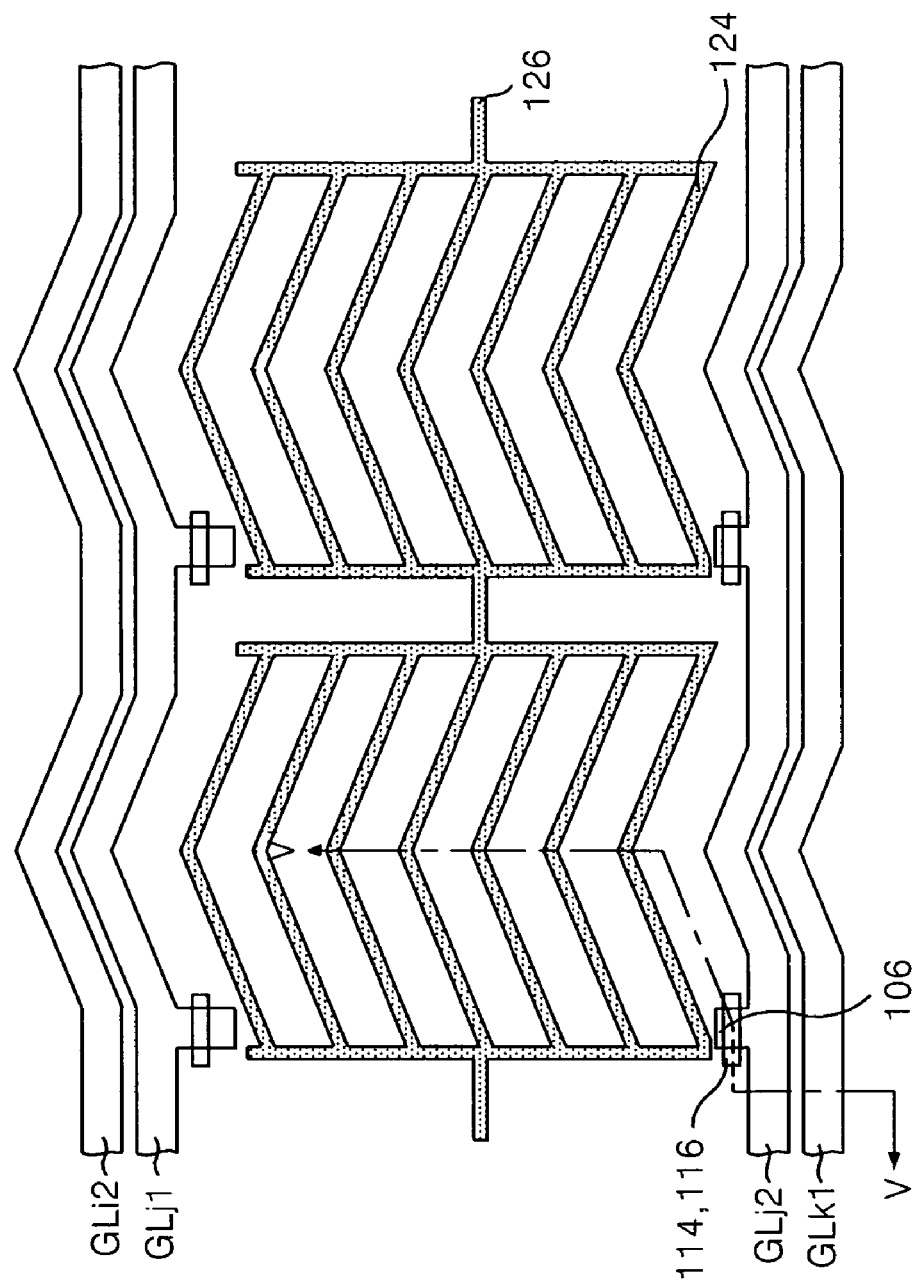

THIN FILM TRANSISTOR ARRAY SUBSTRATE AND FABRICATING METHOD THEREOF

This application claims the benefit of the Korea Patent Application No. 2003-0090305 filed in Korea on Dec. 11, 2003, which is hereby incorporated by reference.

BACKGROUND OF THE INVENTION

1. Field of the Invention

The present invention relates to a liquid crystal display, and more particularly to a thin film transistor array substrate and a fabricating method thereof that improves an aperture ratio.

2. Description of the Related Art

Generally, a liquid crystal display (LCD) controls light transmittance of liquid crystal material using an electric field to display a picture. The liquid crystal displays are largely classified into a vertical electric field type and a horizontal electric field type depending on a direction that the electric field drives the liquid crystal material.

The vertical electric field applying type LCD drives a liquid crystal material in a twisted nematic (TN) mode where a vertical electric field is formed between a pixel electrode and a common electrode arranged opposite to each other on the upper and lower substrates. The vertical electric field applying type LCD has an advantage of a large aperture ratio while having a drawback of a narrow viewing angle of about 90°.

The horizontal electric field applying type LCD drives a liquid crystal material in an in plane switch (IPS) mode where a horizontal electric field is formed between the pixel electrode and the common electrode arranged in parallel to each other on the lower substrate. The horizontal electric field applying type LCD has an advantage of a wide viewing angle of about 160°.

Hereinafter, the horizontal electric field applying type will be described in detail.

FIG. 1 is a plan view showing a structure of a thin film transistor array substrate in a related art liquid crystal display of horizontal electric applying type LCD, and FIG. 2 is a cross-sectional view of the thin film transistor array substrate taken along cross-sectional line II–II' of FIG. 1.

Referring to FIG. 1 and FIG. 2, the related art thin film transistor array substrate includes a gate line 2 and a data line 4 disposed on a lower substrate 1 and intersecting each other, a thin film transistor 30 formed at each intersection, a pixel area defined by the intersection structure, a pixel electrode 22 and a common electrode 24 formed at a pixel area to form a horizontal field, and a common line 26 connected to the common electrode 24.

The gate line 2 applies a gate signal to the gate electrode 6 of the thin film transistor 30. The data line 4 applies a pixel signal to the pixel electrode 22 via a drain electrode 10 of the thin film transistor 30. The gate line 2 and the data line 4 are disposed to form an intersection structure so that a pixel area is defined. The common line 26 is disposed in parallel with the gate line 2 having the pixel area therebetween to supply a reference voltage to the common electrode 24 for driving a liquid crystal material.

The thin film transistor 30 allows the pixel signal supplied from the data line 4 to be charged and maintained in the pixel electrode 22 in response to the gate signal applied from the gate line 2. The thin film transistor 30 includes a gate electrode 6 connected to the gate line 2, a source electrode 8 connected to the data line 4, and a drain electrode 10 connected to the pixel electrode 22. Furthermore, the thin film transistor 30 includes an active layer (not shown) overlapping the gate electrode 6 having a gate insulating film 12 therebetween to define a channel portion between the source electrode 8 and the drain electrode 10, and an ohmic contact layer 16 for making an ohmic contact with the source electrode 8 and the drain electrode 10.

The pixel electrode 22 is connected to the drain electrode 10 of the thin film transistor 30 and is provided at the pixel area via a contact hole 20 defined through a protective film 18. Specifically, the pixel electrode 22 includes a first horizontal portion 22a connected to the drain electrode 10 and disposed in parallel with adjacent gate lines 2, a second horizontal portion 22b overlapping the common line 26, and an extended portion 22c provided in parallel to the common electrode 24 disposed between the first and second horizontal portions 22a and 22b. The common electrode 24 connected to the common line 26 is provided at the pixel areas. Specifically, the common electrode 24 is disposed in parallel with the extended portion 22c of the pixel electrode 22 at the pixel area 5.

Accordingly, a horizontal electric field is formed between the pixel electrode 22 to which a pixel signal is supplied via the thin film transistor 30 and the common electrode 24 to which a reference voltage is supplied via the common line 26. Specifically, the horizontal electric field is formed between the extended portion 22c of the pixel electrode 22 and the common electrode 24. Liquid crystal material arranged in the horizontal direction between the thin film transistor array substrate and the color filter array substrate rotate due to a dielectric anisotropy of the horizontal electric field. Transmittance of light through the pixel area 5 is varied depending upon a rotation extent of the liquid crystal material, thereby implementing a gray level scale.

The common electrode 24 adjacent to the data line 4 has a width of more than about 10 μm. Accordingly, an electric field formed between the common electrode 24 and the pixel electrode 22 is maintained and not influenced by a data signal of the data line 4. In other words, an alignment of the liquid crystal material disposed in an area between the common electrode 4 adjacent to the data line 4 and the pixel electrode 22 is influenced by the data signal, which changes the light transmittance within the instant area, thereby generating a vertical cross talk. To prevent this, a width of the common electrode 24 adjacent to the data line 4 is formed having an increased width to shield the data signal from the vertical cross talk. However, such an increased width of the common electrode 24 raises a problem in the aperture ratio reduction.

Furthermore, the common electrode 24 and the pixel electrode 22 are disposed in parallel with each other in a direction parallel to the data line 4. The common line 26 supplying a reference voltage to the common electrode 24 and the gate lines are formed simultaneously. The common line is disposed in a direction parallel to the gate line 2. The common line 26 occupies a portion of the pixel area 5, thereby reducing the total pixel area and causing deterioration of the aperture ratio.

Moreover, the liquid crystal material between the pixel electrode 22 and the common electrode 24 is rotated in a predetermined direction by the applied electric field. However, the liquid crystal material disposed between driving electrodes (i.e., the common electrode 24 adjacent to the gate line 2 and the pixel electrode 22) is rotated in a different direction from the pixel area 5 due to the difference in electric field between the gate line 2 and the driving electrod. As shown in FIG. 3, when the pixel area displays black, light leaks in an area between the gate line 2 and the driving electrode. Accordingly, no electric field is applied between the common electrode 24 and the pixel electrode 2. To prevent this, the driving electrode and the gate line 2 are spaced by a distance "d" of about 25 to 28 µm. Since this distance "d" is formed at each side of the pixel area, there raised a problem in that deterioration of an aperture ratio by the distance "d", may be as much as 56 µm. In addition, the pixel electrode 22 and the common line 26 provided in the pixel area to shut off the gate signal are occupying the separate portions of the pixel areas, thereby deteriorating the aperture ratio.

SUMMARY OF THE INVENTION

Accordingly, the present invention is directed to a thin film transistor array substrate and fabricating method thereof that substantially obviates one or more of the problems due to limitations and disadvantages of the related art.

An object of the present inventor is to provide a thin film transistor array substrate that improves an aperture ratio.

Another object of the present invention is to provide a fabricating method of thin film transistor array substrate that improves the aperture ratio.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the thin film transistor array substrate and fabricating method thereof includes a thin film transistor array substrate structure having a plurality of data lines; a plurality of gate lines intersecting the data lines to define pixel areas, the gate line being adjacent to at least two pixel areas; a plurality of common lines disposed between the at least two pixel areas; a plurality of thin film transistors formed at each intersection between the gate lines and the data lines; a plurality of common electrodes provided substantially parallel to the common lines; and a plurality of pixel electrodes connected to the thin film transistors.

In another aspect, a method of fabricating a thin film transistor array substrate structure includes forming a gate line, a gate electrode connected to the gate line, a common line on a substrate, the common line disposed between at least two gate lines; forming a gate insulating film on the substrate; forming a semiconductor layer on the gate insulating film; forming a data line, a source electrode and a drain electrode on the semiconductor pattern; forming a protective film on the substrate; and forming a pixel electrode on the protective film, wherein the gate lines are disposed adjacently to each of at least two pixel areas.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 8A and FIG. 8B are a plan view and a cross-sectional view for explaining a fabricating method for forming the semiconductor pattern of FIG. 4 and FIG. 5;

DETAILED DESCRIPTION OF THE PREFERRED EMBODIMENTS

Reference will now be made in detail to the preferred embodiments of the present invention, examples of which are illustrated in the accompanying drawings.

The preferred embodiments of the present invention will be described in detail with reference to FIGS. 4 to 11B.

Figure 1:
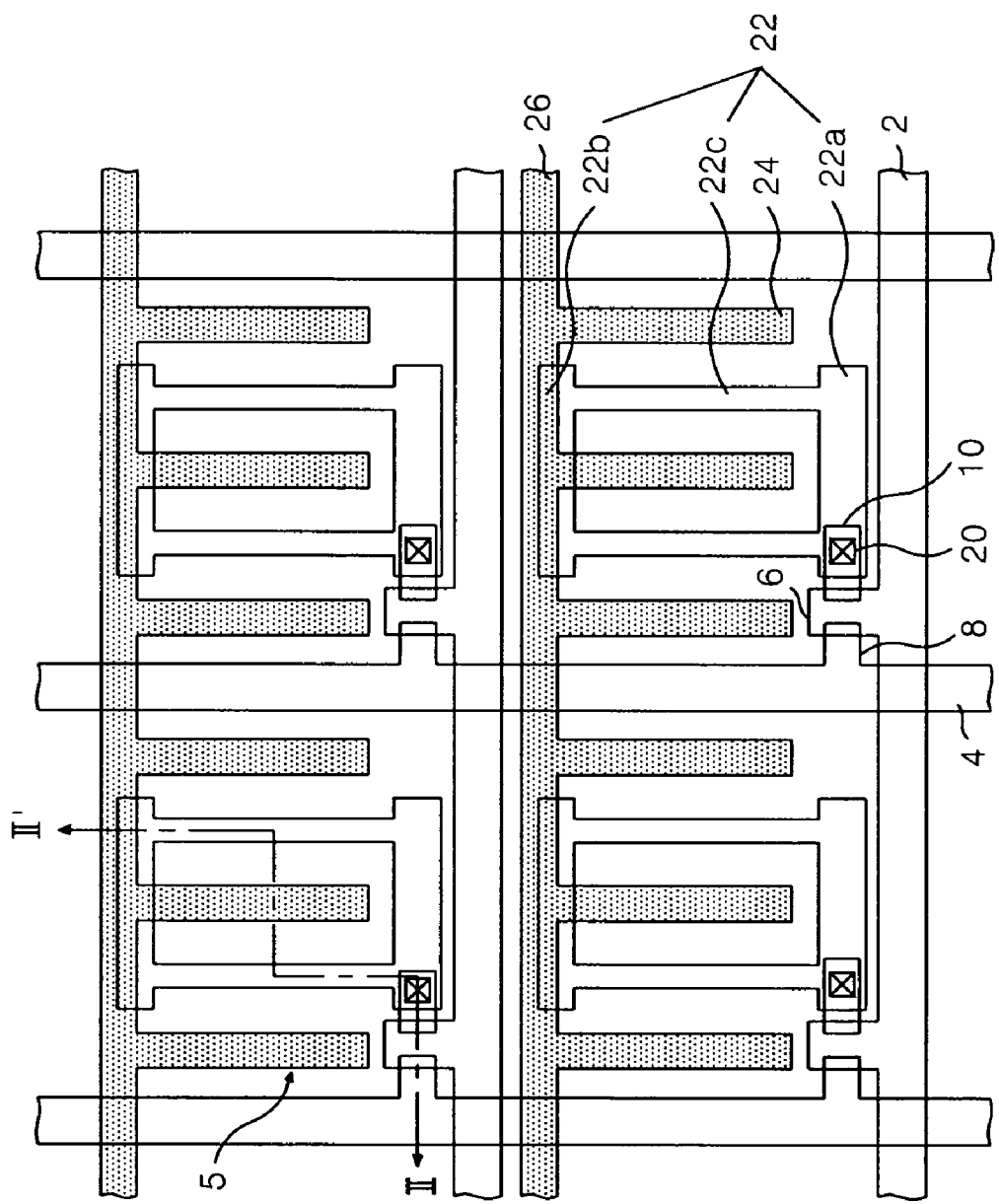
FIG. 1 is a plan view showing a structure of a thin film transistor array substrate in a related art horizontal electric field applying type liquid crystal display (LCD)
Figure 2:
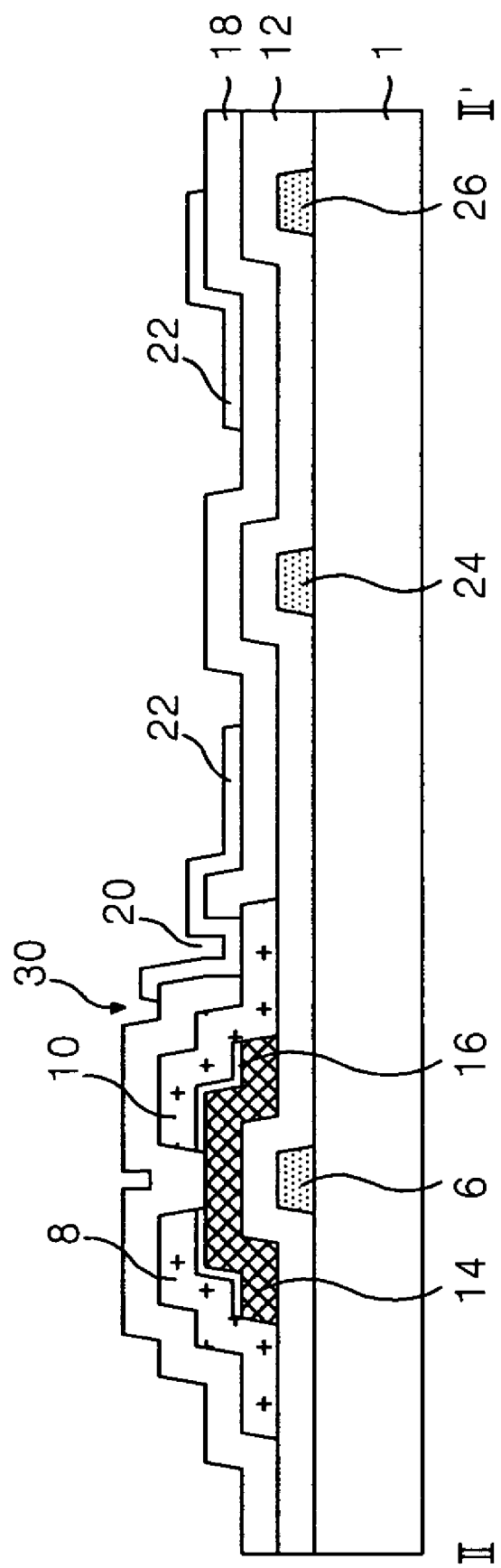
FIG. 2 is a cross-sectional view of the thin film transistor array substrate taken along line II–II' of FIG. 1.
Figure 3:
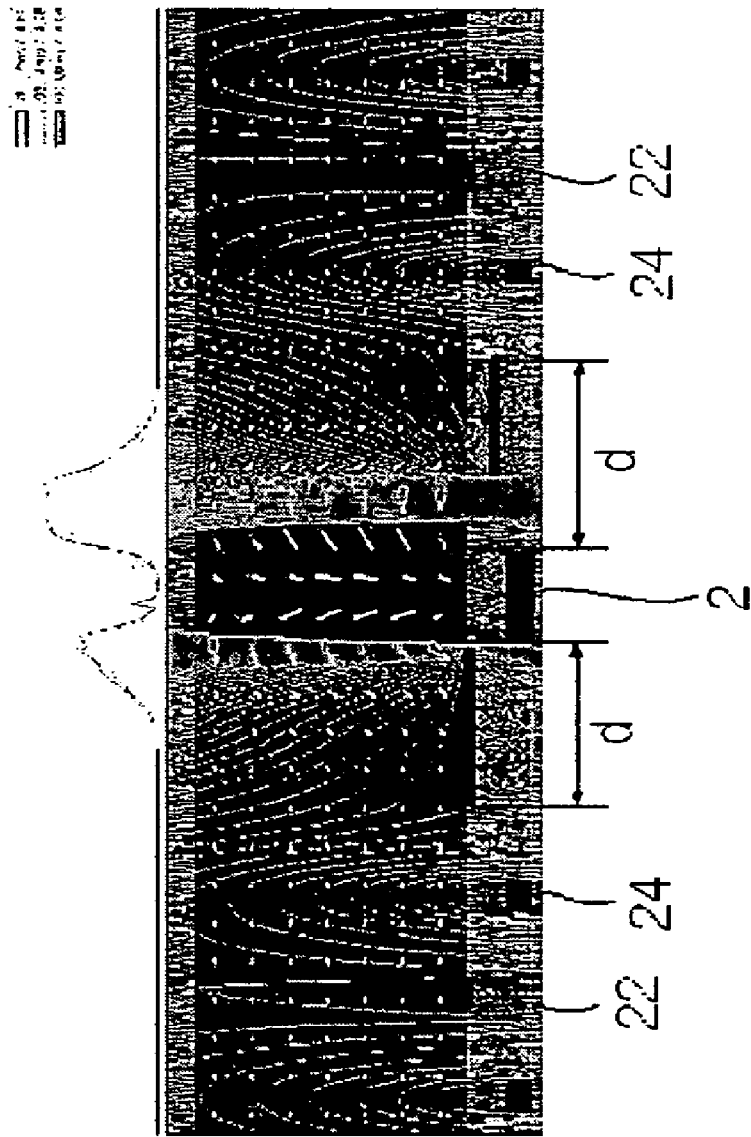
FIG. 3 is a view explaining a light leakage phenomenon between the signal line and the driving electrode of FIG. 1 and FIG. 2.
Figure 4:
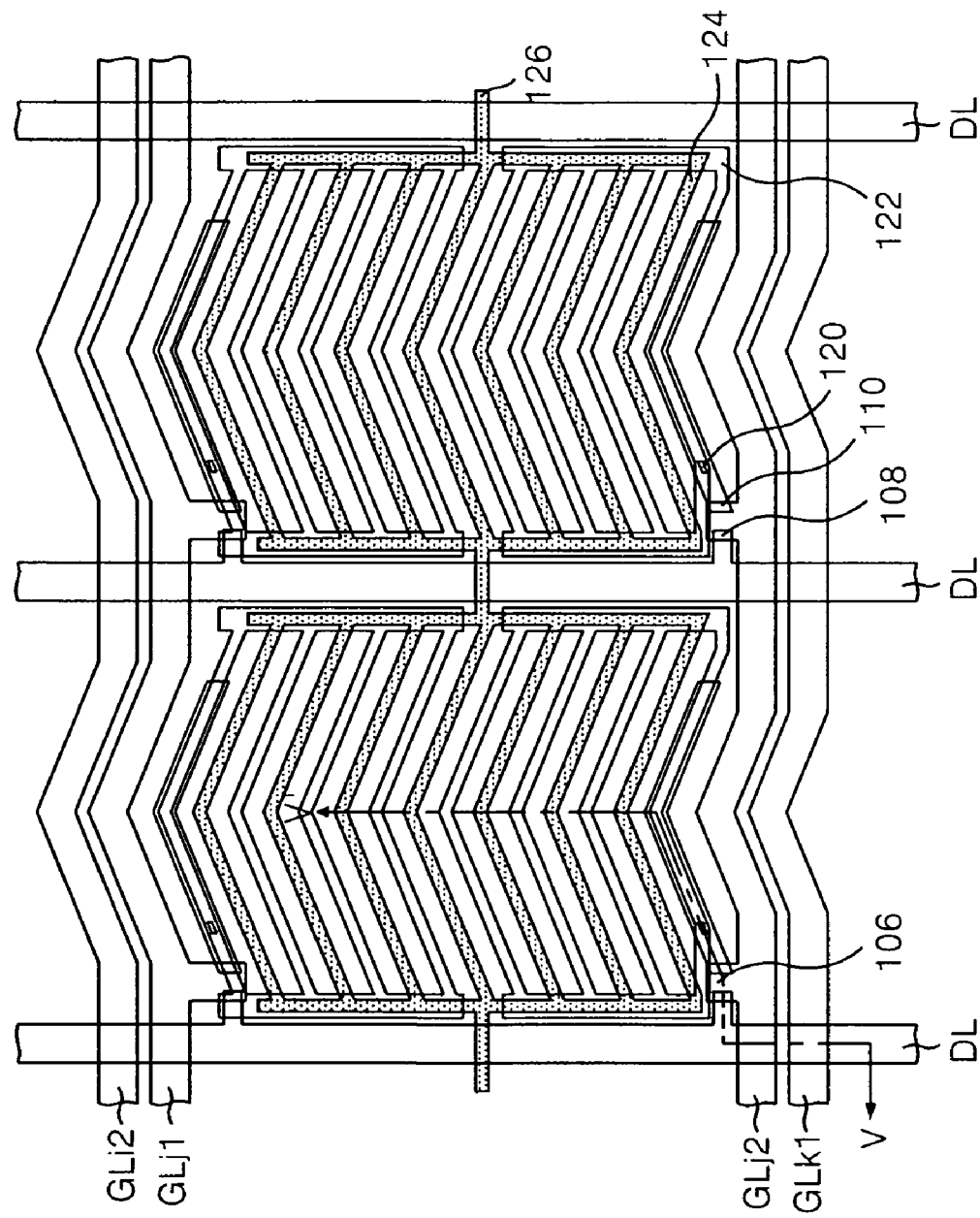
FIG. 4 is a plan view showing a structure of a thin film transistor array substrate according to an exemplary embodiment of the present invention.
Figure 5:
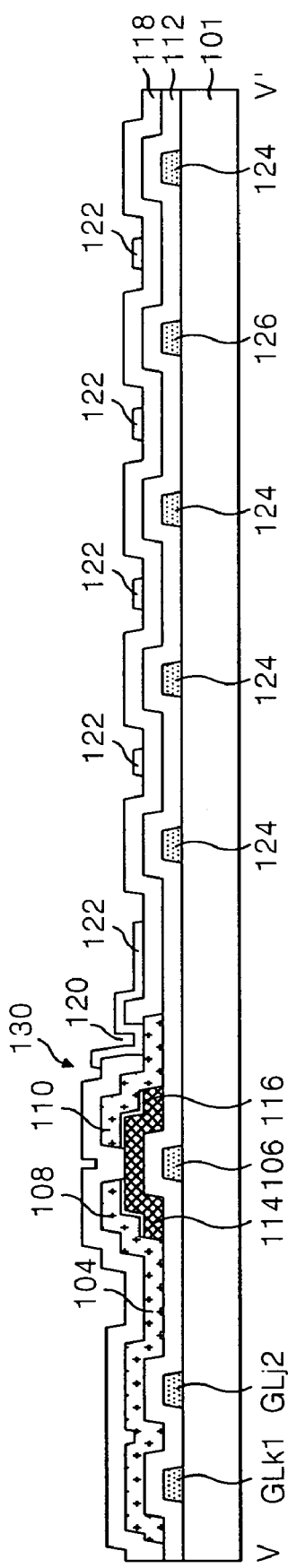
FIG. 5 is a cross-sectional view of the thin film transistor array substrate taken along line V–V' line of FIG. 4.

FIG. 4 is a plan view showing a structure of a thin film transistor array substrate according to an embodiment of the present invention. FIG. 5 is a cross-sectional view of the thin film transistor array substrate taken along line V–V' of FIG. 4.

Referring to FIG. 4 and FIG. 5, the thin film transistor array substrate includes a gate line 102 and a data line 104 disposed on a lower substrate and intersecting each other, a pixel area defined by the intersection structure, a thin film transistor 130 formed at each intersection, a pixel electrode 122 and a common electrode 124 disposed at the pixel area to form a horizontal field, and a common line 126 connected to the common electrode 124.

The gate line 102 applies a gate signal to the gate electrode 106 of the thin film transistor 130. The gate line 102 is disposed such that the odd-numbered gate lines . . . , GLj1, GLk1, . . . are adjacent to the pre-stage even-numbered gate lines . . . , GLi2, GLj2, . . . . For instance, the (i2)th gate line GLi2 is adjacent to the (j1)th gate line GLj1, and the (j2)th gate line GLj2 is adjacent to the (k1)th gate line GLk1. The data line 104 applies a pixel signal to the pixel electrode 122 via a drain electrode 110 of the thin film transistor 130.

Figure 6:
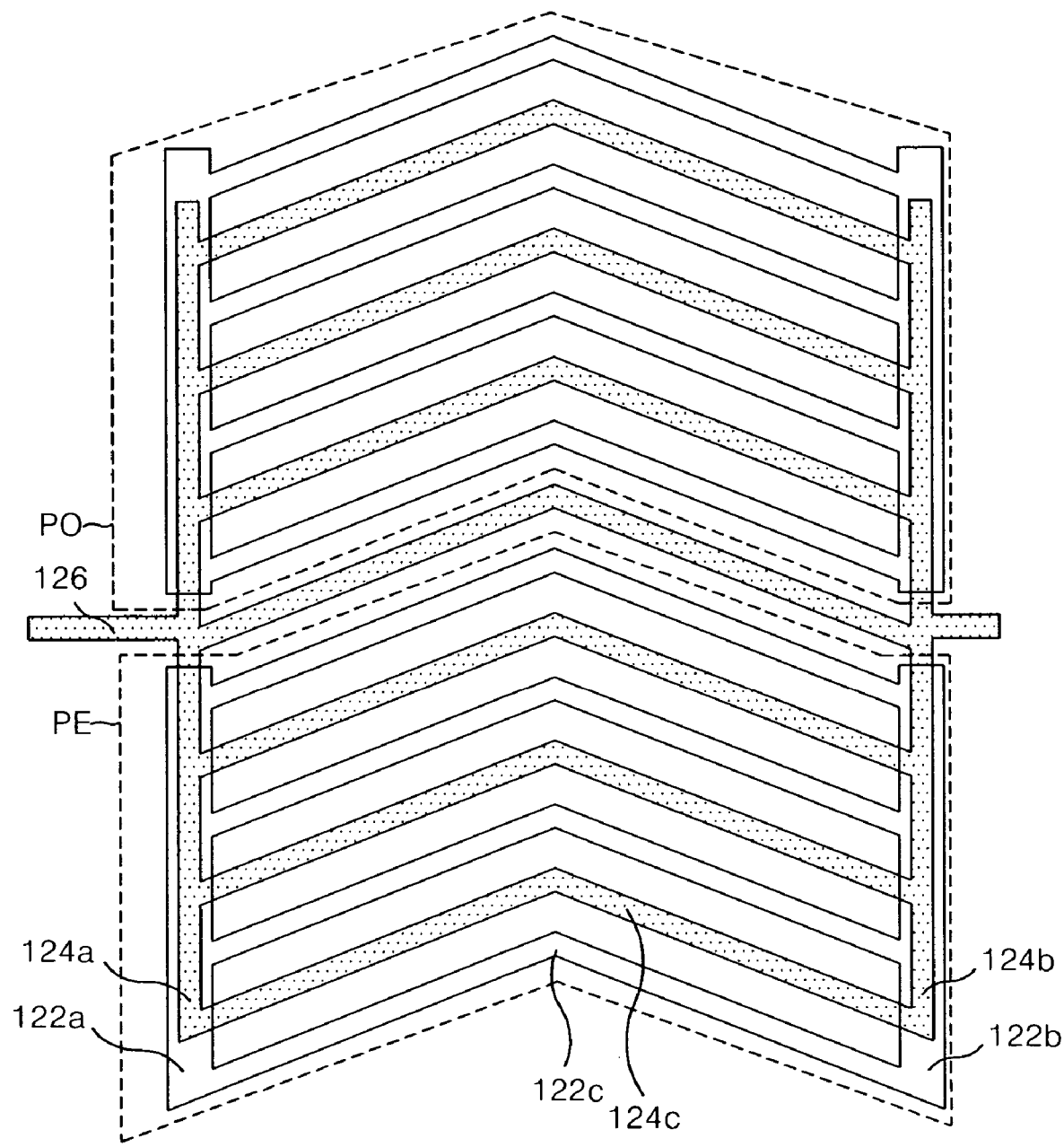
FIG. 6 is a detailed plan view of the common electrode and the pixel electrode of FIG. 4.

The common line 126 is disposed parallel to the gate line 102 having the pixel area therebetween to supply a reference voltage to the common electrode 124 for driving a liquid crystal material. As shown in FIG. 6, the common line 126 is disposed between an odd pixel area PO corresponding to the odd-numbered gate line GLj1 and an even pixel area PE corresponding to the even-numbered gate line GLj2. The common line 126 supplies a reference voltage to the common electrode 124 of each of the odd and even pixel areas PO and PE.

The thin film transistor 130 allows the pixel signal supplied from the data line 104 be charged and maintained in the pixel electrode 122 in response to the gate signal supplied from the gate line 102. The thin film transistor 130 includes a gate electrode 106 connected to the gate line 102, a source electrode 108 connected to the data line 104, and a drain electrode 110 connected to the pixel electrode 122.

Furthermore, the thin film transistor 130 includes an active layer (not shown) overlapping the gate electrode 106 having a gate insulating film 112 therebetween to define a channel portion between the source electrode 108 and the drain electrode 110, and an ohmic contact layer 116 for forming an ohmic contact with the source electrode 108 and the drain electrode 110.

The pixel electrode 122 is disposed at the pixel area and is connected to the drain electrode 110 via a contact hole 120 defined through a protective film 118. As shown in FIG. 6, the pixel electrode 122 includes first and second vertical portions 122a and 122b. The first and second vertical portions 122a and 122b are disposed parallel to the data line 104, and also overlaps the vertical portions 124a and 124b of the common electrode 124. An extended portion 122c disposed between the first and second vertical portions 122a and 122b is arranged to be parallel with a horizontal portion 124c of the common electrode 124. The extended portion 122c takes a comb shape having a bent portion.

The common electrode 124 is connected to the common line 126 and is disposed at the pixel area. As shown in FIG. 6, the common electrode 124 includes first and second vertical portions 124a and 124b branched from the common line 126, and a horizontal portion 124c disposed between the first and second vertical portions 124a and 124b. The horizontal portion 124c is provided in a comb shape having a bent portion. The horizontal portion 124c is arranged to be parallel with the extended portion 122c of the pixel electrode 122. Accordingly, a multi-domain structure can be formed using the liquid crystal material disposed within at least one pixel area that is adapted to align in various directions when an electric field is applied. Thus, birefringence depending on the alignment direction of the liquid crystal material, may be canceled to minimize a color shift phenomenon. In addition, an area having no gray level inversion may be enlarged.

In such a thin film transistor array substrate, a horizontal electric field is formed between the pixel electrode 122 to which a pixel signal is supplied via the thin film transistor 130 and the common electrode 124 to which a reference voltage is supplied via the common line 126. Specifically, the horizontal electric field is formed between the extended portion 122c of the pixel electrode 122 and the horizontal portion 124c of the common electrode 124. Liquid crystal material arranged in the horizontal direction between the thin film transistor array substrate and the color filter array substrate rotates due to a dielectric anisotropy formed by the horizontal electric field. Transmittance of a light transmitting the pixel area is differentiated depending upon a rotation extent of the liquid crystal molecules, thereby implementing a gray level scale.

As mentioned above, the thin film transistor array substrate according to the embodiment of the present invention is provided such that the odd-numbered gate lines are adjacent to the pre-stage even-numbered gate lines. Accordingly, at least one of the gate lines is constrained at one side of the pixel area. As a result, a portion of the pixel area influenced by the gate signal becomes limited to any one of the horizontal portions of the pixel area disposed adjacently to the gate line. Thus, only one side of the pixel area adjacent to the gate line is spaced at a predetermined distance from the gate line. A predetermined distance from the gate line to each pixel and ranges between 25 to 28 μm. Accordingly, the spaced distance can be reduced to approximately a half of that in the related art, thereby improving an aperture ratio.

Furthermore, the common line 126 is disposed substantially parallel to the horizontal portion of 124c. The common line 126 is provided for a pair of two gate lines such that the two gate lines define the edges of the pixel areas. And, two pixel areas formed side by side shares at least one portion of the common line 126. Accordingly, an area occupied by the common line in the pixel areas is reduced as compared to the related art, hence, improving an aperture ratio further.

Figure 7A:
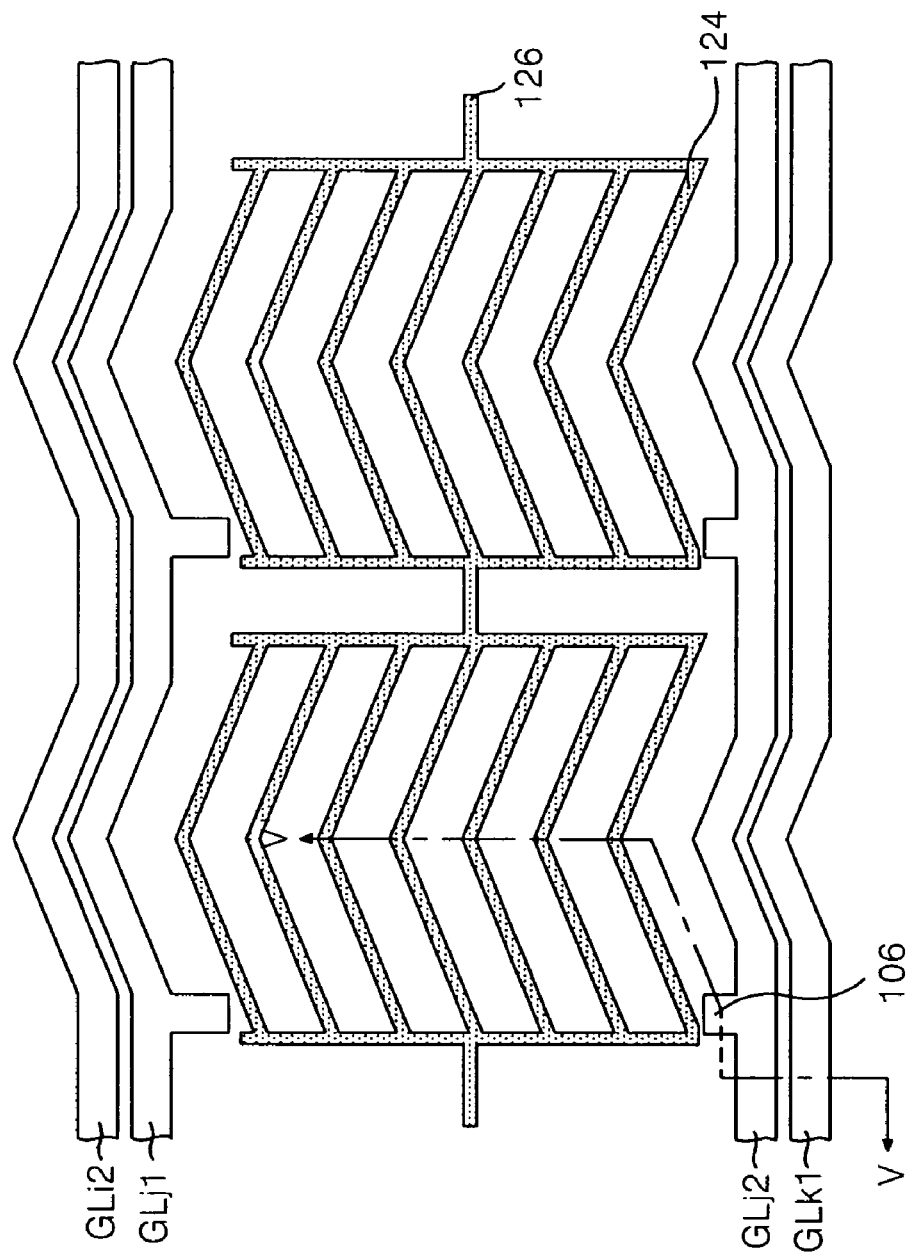
FIG. 7A and FIG. 7B are a plan view and a section view for explaining a fabricating method for forming the first conductive pattern group of FIG. 4 and FIG. 5.
Figure 7B:
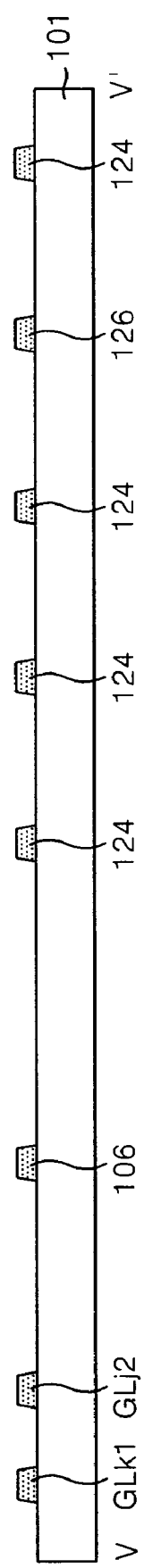

FIG. 7A to FIG. 11B are plan views and cross-sectional views representing a method of fabricating the thin film transistor array substrate according to the embodiment of the present invention. Referring to FIG. 7A and FIG. 7B, a first conductive pattern group including the gate line 102 formed of a plurality of lines GLk1 and GLk2 (k=any index letter), the gate electrode 106, the common electrode 124 and the common line 126 is disposed on the lower substrate 101 parallel to the gate line.

More specifically, a gate metal layer is disposed on the lower substrate 101 by a deposition technique such as sputtering. The gate metal layer is made from an aluminum (Al) group metal, copper (Cu), chrome (Cr) or other suitable material. Then, the gate metal layer are patterned by photolithography and etching process to form the first conductive pattern group. As shown in FIG. 7A, the gate line 102 disposed having the odd-numbered gate lines disposed adjacent to the even-numbered gate lines. And, the common line 126 is positioned between the even-numbered gate line and the odd-numbered gate line which are defining the pixel area, by a predetermined distance from each gate lines.

Figure 8B:
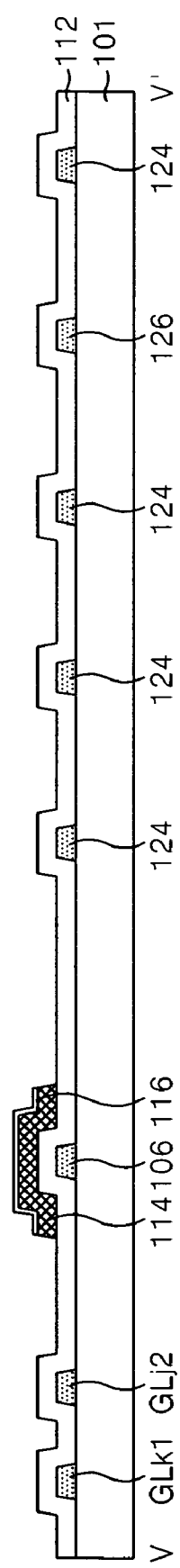

Referring to FIG. 8A and FIG. 8B, the gate insulating film 112 is disposed on the lower substrate 101 provided with the first conductive pattern group. Furthermore, a semiconductor pattern including the active layer 114 and the ohmic contact layer 116 is formed on the gate insulating film 112.

More specifically, the gate insulating film 112 and the first and second semiconductor layers are sequentially disposed on the lower substrate 101 provided with the first conductive pattern group by a deposition method such as PEVCD, sputtering or other suitable technique. The gate insulating film 112 is formed from an inorganic insulating material including silicon nitride ($SiN_x$), silicon oxide ($SiO_x$), an organic insulating material including BCB (Benzocyclobutene), an acrylic resin or PFCB (Perfluorocyclobutene), or any other suitable material. The first semiconductor layer is formed from amorphous silicon not doped with an impurity while the second semiconductor layer is formed from amorphous silicon doped with an N-type or P-type impurity. Then, the first and second semiconductor layers are patterned by photolithography and etching process to provide a semiconductor pattern including the active layer 114 and the ohmic contact layer 116.

Figure 9A:
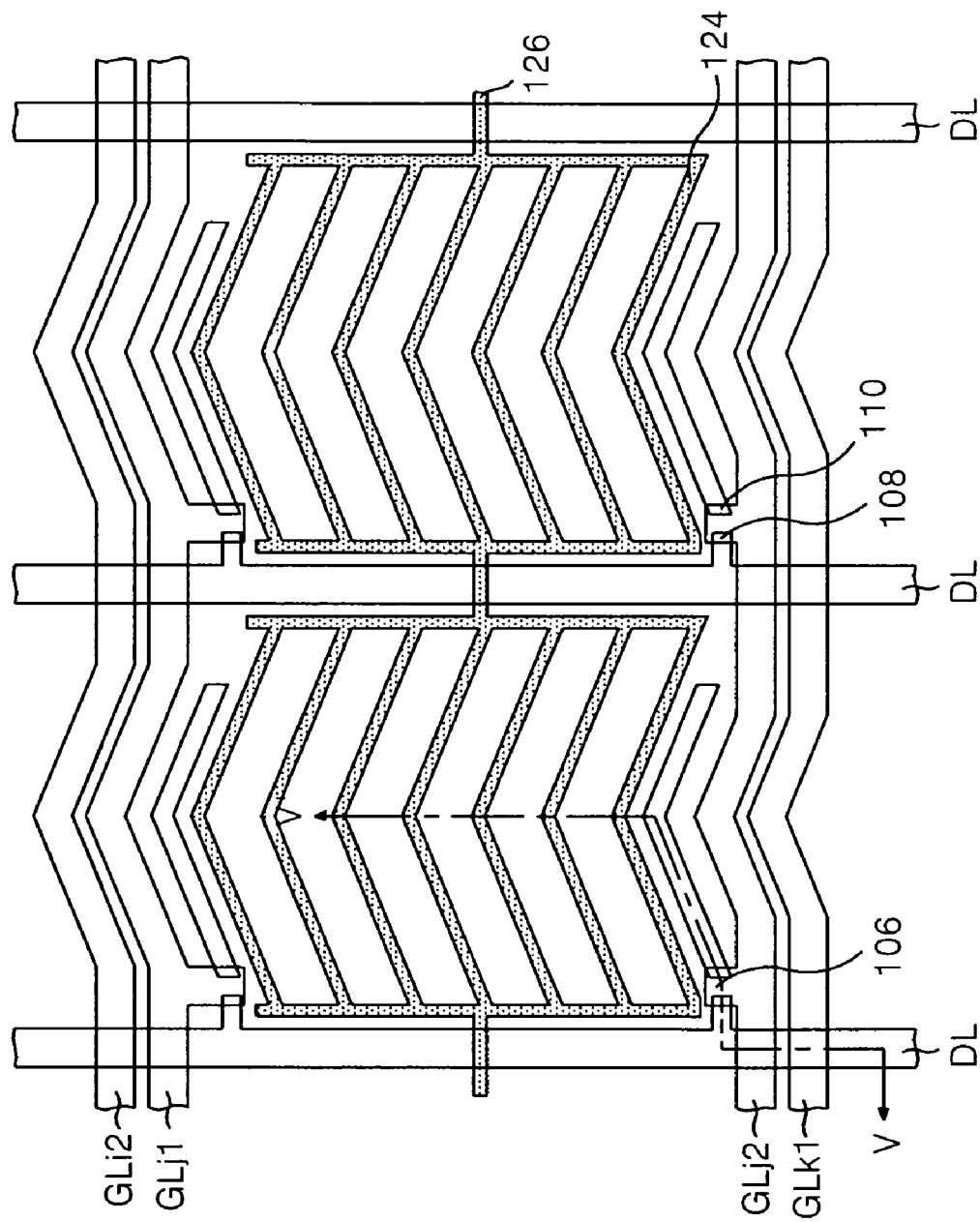
FIG. 9A and FIG. 9B are a plan view and a cross-sectional view for explaining a fabricating method for forming the protective film having the contact hole of FIG. 4 and FIG. 5.
Figure 9B:
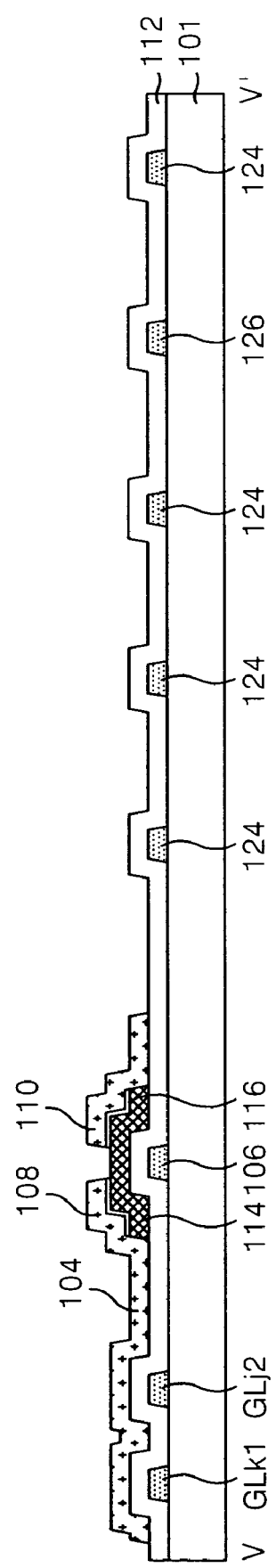

Referring to FIG. 9A and FIG. 9B, a second conductive pattern group including the source electrode 108, the drain electrode 110, and the data line 104 is formed on the gate insulating film 112 provided with the semiconductor pattern. More specifically, a data metal layer is disposed on the gate insulating film 112 provided with the semiconductor pattern by a deposition technique such as sputtering, or other suitable technique.

The data metal layer is formed from copper (Cu), molybdenum (Mo), titanium (Ti), tantalum (Ta), a molybdenum alloy or other suitable material. The data metal layer is patterned by photolithography and etching process to provide second conductive pattern group. Thereafter, as shown in FIG. 9B, the ohmic contact layer 116 disposed at the channel portion is removed by dry etching using the source electrode 108 and the drain electrode 110 as a mask, thereby exposing the active layer 114 at the channel portion.

Figure 10A:
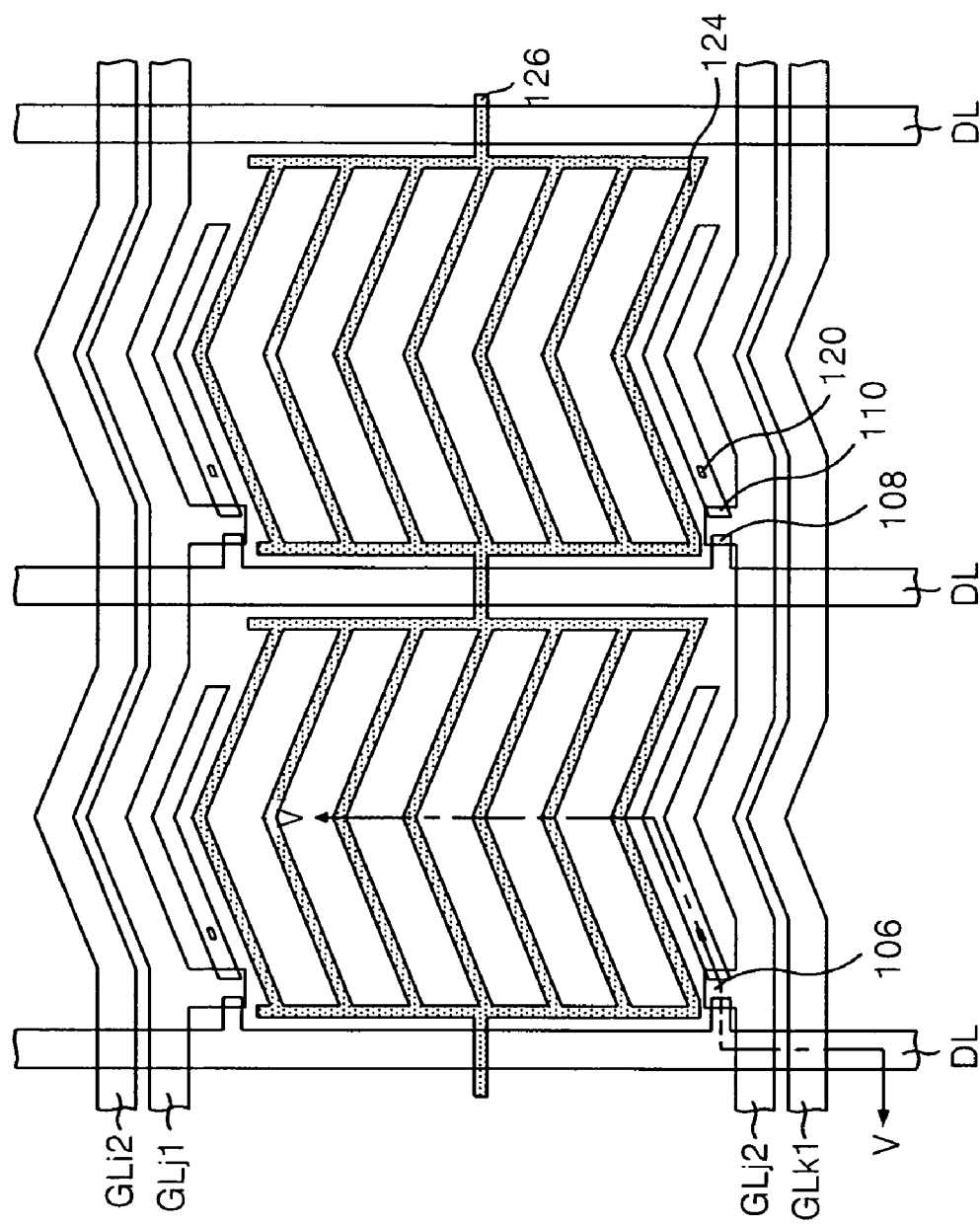
FIG. 10A and FIG. 10B are a plan view and a cross-sectional view for explaining a fabricating method for forming the protective film having the contact hole of FIG. 4 and FIG. 5.
Figure 10B:
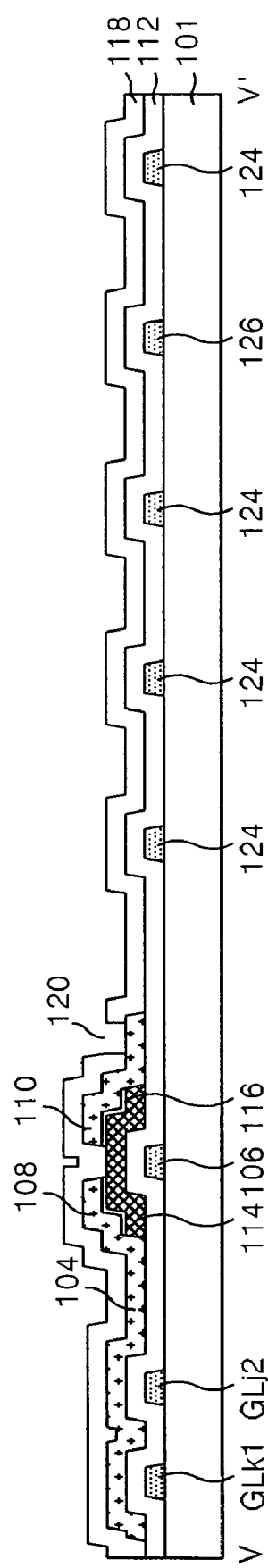

Referring to FIG. 10A and FIG. 10B, the protective film 118 is disposed on the gate insulating film 112 provided with the second conductive pattern group. The contact hole 120 is defined through protective film 118. The protective film 118 is entirely disposed on the gate insulating film 112 provided with the second conductive pattern group by a deposition method such as PECVD, or other suitable technique. The protective film is formed from an inorganic insulating material identical to that of the gate insulating film 1112, or an organic insulating material such as an acrylic organic compound having a small dielectric constant, BCB (benzocyclobutene), PFCB (perfluorocyclobutane), or any other suitable material. The protective film 118 is patterned by photolithography and etching process to thereby provide the contact hole 120. The contact hole 120 passes through the protective film to expose a portion of the drain electrode 110.

Figure 11A:
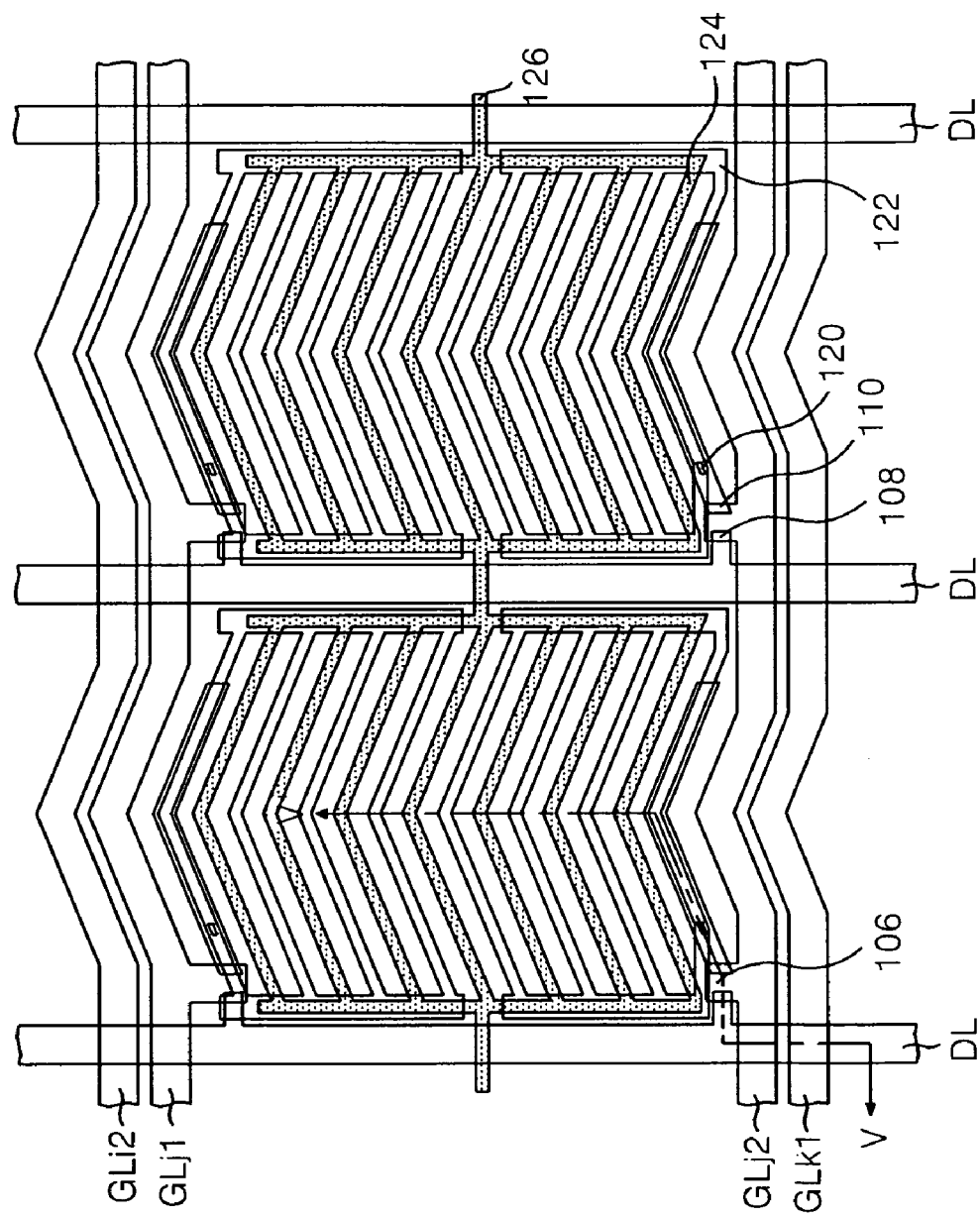
FIG. 11A and FIG. 11B are a plan view and a cross-sectional view for explaining a fabricating method for forming the third conductive pattern group of FIG. 4 and FIG. 5.
Figure 11B:
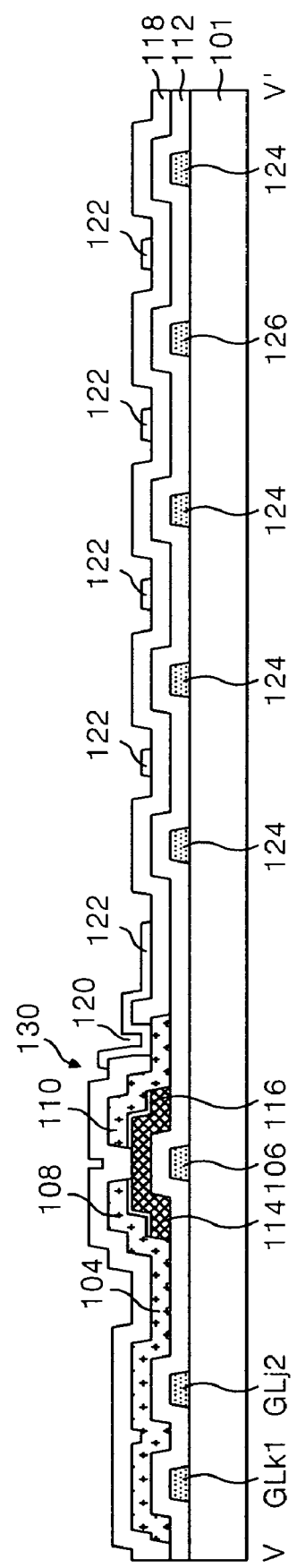

Referring to FIG. 11A and FIG. 11B, a third conductive pattern group including the pixel electrode 122 is formed on the protective film 118. More specifically, a transparent conductive film is disposed on the protective film 118 by a deposition method such as sputtering, or other suitable technique. The transparent conductive film is formed from indium-tin-oxide (ITO), tin-oxide (TO), indium-zinc-oxide (IZO) or indium-tin-zinc-oxide (ITZO), or other suitable material. The transparent conductive film is patterned by photolithography and etching process to provide a third conductive pattern group including the pixel electrode 122. The pixel electrode 122 is electrically connected to the drain electrode 110 via the contact hole 120. The pixel electrode 122 is formed in parallel with the gate line 102 and forms a horizontal electric field with horizontal portion of the common electrode 124.

As described above, according to the present invention, data line is formed of odd-numbered gate lines and even-numbered gate lines, where the odd-numbered gate lines are disposed adjacent to the pre-stage even-numbered gate lines. Accordingly, only one side of the pixel area adjacent to the gate line (i.e., edges of the pixel areas) is required to be spaced apart from the gate line. Thus, the predetermined distance from the gate line to each pixel area is minimized to about 25 to 28 μm. Furthermore, in the embodiment, two pixel areas sharing a same portion of the common line, so that an area occupied by the common line may be reduced to approximately a half that of the related art, thereby improving an aperture ratio.

It will be apparent to those skilled in the art that various modifications and variations can be made in the thin film transistor array substrate and fabricating method thereof of the present invention without departing from the spirit or scope of the invention. Thus, it is intended that the present invention cover the modifications and variations of this invention provided they come within the scope of the appended claims and their equivalents.

What is claimed is:

1. A method of fabricating a thin film transistor array substrate structure, comprising:
   forming a gate line, a gate electrode connected to the gate line, a common line on a substrate, the common line disposed between at least two gate lines, wherein the at least two gate lines and the data line define a pixel area;
   forming a gate insulating film on the substrate;
   forming a semiconductor layer on the gate insulating film;
   forming a data line, a source electrode and a drain electrode on the semiconductor;
   forming a protective film on the substrate; and
   forming a pixel electrode on the protective film, wherein the gate lines are disposed adjacently to each of at least two pixel areas, and wherein each respective one of odd-numbered gate lines are adjacent to a respective one of pre-stage even-numbered gate lines.

2. The method as claimed in claim 1, wherein the pixel electrode includes first and second vertical portions disposed parallel to the data line and a finger portion between the first and second vertical portions.

3. The method as claimed in claim 2, wherein the common electrode includes first and second vertical portions extended vertically from the common line and a finger portion between the first and second vertical portions.

4. The method as claimed in claim 3, wherein the finger portion of the pixel electrode and the horizontal portion of the common electrode have a comb shape having a bent portion.

5. The method as claimed in claim 1, wherein the common lines are formed between the odd-numbered gate lines and the even-numbered gate lines in the pixel areas.

* * * * *